(12) United States Patent
Nishihara et al.

(10) Patent No.: US 9,786,509 B2
(45) Date of Patent: Oct. 10, 2017

(54) WAFER PROCESSING METHOD (71) Applicant: DISCO CORPORATION, Tokyo (JP)

(72) Inventors: Ryosuke Nishihara, Tokyo (JP);
Minoru Matsuzawa, Tokyo (JP);
Kohei Tsujimoto, Tokyo (JP);
Tetsukazu Sugiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 14/835,298

(22) Filed: Aug. 25, 2015

(65) Prior Publication Data

US 2016/0064230 A1    Mar. 3, 2016

(30) Foreign Application Priority Data

Aug. 26, 2014   (JP) ................................ 2014-172005

(51) Int. Cl.
*H01L 21/304* (2006.01)
*B24B 1/00* (2006.01)
*B24B 37/10* (2012.01)
*B24B 7/22* (2006.01)
*B24B 37/04* (2012.01)
*B24B 37/30* (2012.01)

(52) U.S. Cl.
CPC .............. *H01L 21/304* (2013.01); *B24B 1/00* (2013.01); *B24B 7/228* (2013.01); *B24B 37/042* (2013.01); *B24B 37/10* (2013.01); *B24B 37/30* (2013.01)

(58) Field of Classification Search
CPC ......... H01L 21/304; B24B 1/00; B24B 7/228; B24B 37/04; B24B 37/042; B24B 37/10; B24B 37/30

USPC .............................. 451/41, 57, 285, 287, 290
See application file for complete search history.

(56) References Cited

U.S. PATENT DOCUMENTS

| 7,758,402 | B2* | 7/2010 | Yoshida | ................... B24B 1/00 |
| | | | | 257/E21.237 |
| 8,029,335 | B2* | 10/2011 | Takahashi | ............... B24B 7/228 |
| | | | | 257/E21.237 |
| 8,535,117 | B2* | 9/2013 | Nakanishi | ............. B24B 21/002 |
| | | | | 451/168 |
| 8,987,122 | B2* | 3/2015 | Nakata | ................... H01L 21/304 |
| | | | | 438/464 |
| 2007/0141955 | A1* | 6/2007 | Masuda | ................... B24B 7/228 |
| | | | | 451/11 |
| 2010/0190416 | A1* | 7/2010 | Schwarzenbach | ...... B24B 9/065 |
| | | | | 451/44 |
| 2011/0136411 | A1* | 6/2011 | Nakanishi | ............... B24B 9/065 |
| | | | | 451/41 |

(Continued)

FOREIGN PATENT DOCUMENTS

JP   2008-042081   2/2008
JP   2009-176896   8/2009

*Primary Examiner* — Eileen Morgan
(74) *Attorney, Agent, or Firm* — Greer Burns & Crain, Ltd.

(57) ABSTRACT

A wafer processing method includes a first grinding step and a second grinding step. In the first grinding step, first grinding abrasives are moved in a processing feed direction that is a direction orthogonal to a holding surface of a chuck table of grinding apparatus and a wafer is ground to form a first circular recess in the back surface of the wafer. In the second grinding step, second grinding abrasives formed of finer abrasive grains than the first grinding abrasives are moved down in an oblique direction from the center side of the wafer toward the periphery of the wafer and the first circular recess is ground.

1 Claim, 11 Drawing Sheets

(56) References Cited

U.S. PATENT DOCUMENTS

2013/0052812 A1* 2/2013 Nakata ............... H01L 21/304
438/514

* cited by examiner

WAFER PROCESSING METHOD

BACKGROUND OF THE INVENTION

Field of the Invention

The present invention relates to a wafer processing method, and particularly to a so-called TAIKO grinding method.

Description of the Related Art

As a processing method for improving handling easiness of a semiconductor wafer while grinding the semiconductor wafer into a very small thickness, a grinding method is known in which the back surface of the semiconductor wafer corresponding to a device region is ground to form a circular recess and an annular projection is left at the peripheral part (for example refer to Japanese Patent Laid-open No. 2009-176896 and Japanese Patent Laid-open No. 2008-42081). In the present specification, this grinding method is defined as TAIKO grinding. In the TAIKO grinding, after the circular recess is roughly formed by rough grinding, finish grinding is further carried out for the bottom surface of the circular recess by an abrasive with a small grain size for the purpose of enhancing the flexural strength of the device region.

When the finish grinding abrasive collides with the inner circumferential wall of the circular recess formed by the rough grinding, the finish grinding abrasive wears or a crack is caused in the inner circumferential wall. For this reason, the finish grinding abrasive moves down slightly inside the inner circumferential wall and grinds the bottom surface at a finish grinding speed from above at a predetermined distance to the bottom surface. The finish grinding abrasive moves down at a high speed until the position above the bottom surface at the predetermined distance because the finish grinding abrasive does not carry out grinding, and thereby the processing time is shortened.

SUMMARY OF THE INVENTION

The device region (the amount of chips) is determined by which position the finish grinding abrasive is located at relative to the inner circumferential wall of the circular recess. Therefore, it is demanded that the finish grinding abrasive be located at a position as close as possible to the inner circumferential wall. The corner linking the inner circumferential wall and the bottom surface of the circular recess has a curved surface shape due to deformation attributed to the wear of the rough grinding abrasive. Thus, when the finish grinding abrasive is brought closer to the outer circumference, a larger area of the curved surface part also needs to be ground by the finish grinding abrasive. The volume of the curved surface part is slight. However, when the processing is carried out at a high speed, the deformation attributed to the wear of the finish grinding abrasive is promoted. As a result, the region obtained as the device region becomes smaller due to increase in the curved surface part after the finish processing. For this reason, conventionally the inside of the curved surface part is ground by the finish grinding abrasive, and the region corresponding to the separation of the finish grinding abrasive from the curved surface part toward the inside and the region that is not successfully ground due to the deformation of the finish grinding abrasive are regions where devices cannot be fabricated.

Therefore, studies have been made on grinding the curved surface part to increase the region obtained as the device region and studies have also been made on a method in which the finish grinding abrasive moves down at a finish grinding speed also when passing through the curved surface part. However, this method involves the following problem. Specifically, if the height of the curved surface part is e.g. about 200 μm, 200 μm is added as the distance of the descent during which processing is carried out at the finish grinding speed and thus the processing time becomes very long.

Thus, an object of the present invention is to provide a wafer processing method that enables expansion of the device region while suppressing extension of the processing time.

In accordance with an aspect of the present invention, there is provided a wafer processing method in which a wafer having a device region where devices are formed in regions marked out by a plurality of streets formed in a front surface in a lattice manner and a peripheral surplus region surrounding the device region is held on a holding surface of a chuck table and a region in a back surface corresponding to the device region is ground by a grinding abrasive to set the thickness of the device region to a predetermined finished thickness. The wafer processing method includes a first grinding step of moving a first grinding abrasive in a processing feed direction that is a direction orthogonal to the holding surface and grinding the wafer to form a first circular recess in the back surface of the wafer, and a second grinding step of moving down a second grinding abrasive formed of finer abrasive grains than the first grinding abrasive in an oblique direction from the center side of the wafer toward periphery of the wafer and grinding the first circular recess.

Preferably, in the second grinding step, a tip outer circumference of the second grinding abrasive is obliquely moved down to a position that is slightly inside an inner circumferential wall of the first circular recess and is slightly above a bottom surface of the first circular recess and part of a curved surface part that links the inner circumferential wall and the bottom surface of the first circular recess is ground. Preferably, the wafer processing method of the present invention includes a third grinding step of moving the second grinding abrasive in the processing feed direction and grinding the bottom surface of the first circular recess to set the thickness of the device region to a predetermined finished thickness after carrying out the second grinding step.

In the wafer processing method of the invention of the present application, when the second grinding abrasive is moved down, it is obliquely moved down from an obliquely upper side on the center side of the wafer toward the periphery of the wafer. This provides an effect that it becomes possible to expand the flat region on the back surface of the wafer corresponding to the device region while suppressing extension of the processing time.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Preferred embodiments for carrying out the present invention will be described in detail with reference to the drawings. The present invention is not limited by contents described in the following embodiments. Furthermore, in constituent elements to be described below, what can be easily envisaged by those skilled in the art and what is substantially the same are included. Moreover, it is possible to combine configurations to be described below with each other as appropriate. Furthermore, various kinds of omission, replacement, or change of configurations can be made without departing from the gist of the present invention.

First Embodiment

Figure 1:
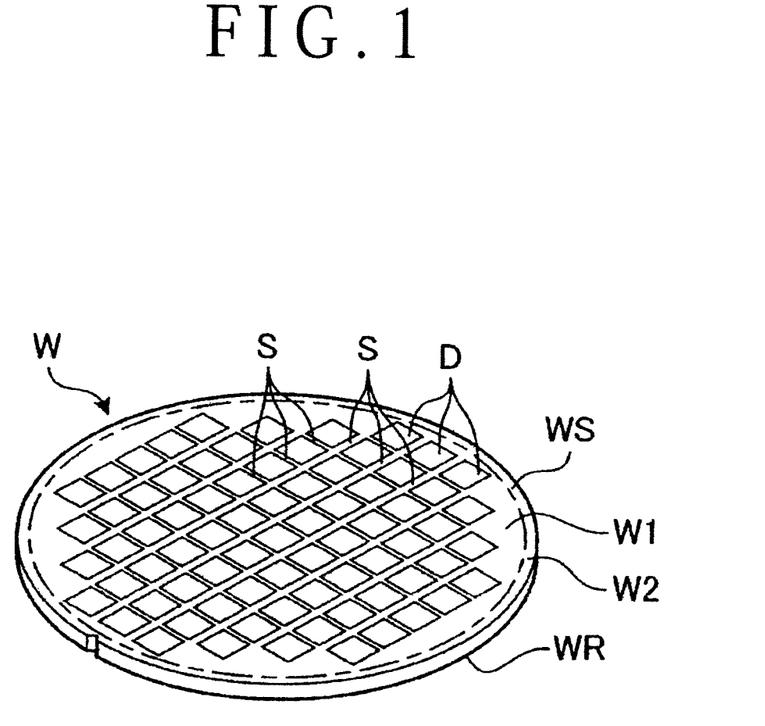
FIG. 1 is a perspective view of a wafer to be processed by a wafer processing method according to a first embodiment.

A wafer processing method according to a first embodiment will be described on the basis of drawings. FIG. 1 is a perspective view of a wafer to be processed by the wafer processing method according to the first embodiment. The wafer processing method according to the first embodiment (hereinafter, referred to simply as the processing method) is a method for processing a wafer W shown in FIG. 1.

The wafer W to be processed by the processing method according to the first embodiment is a semiconductor wafer or an optical device wafer that has a circular plate shape and is composed of silicon, sapphire, gallium, or the like as its matrix material in the first embodiment. As shown in FIG. 1, the wafer W has a device region W1 where devices D are formed in regions marked out by plural streets S formed in a front surface WS in a lattice manner and a peripheral surplus region W2 surrounding the device region W1. Although the boundary between the device region W1 and the peripheral surplus region W2 is shown by a one-dot chain line in FIG. 1 for convenience, no line exists at the boundary in practice.

Figure 3:
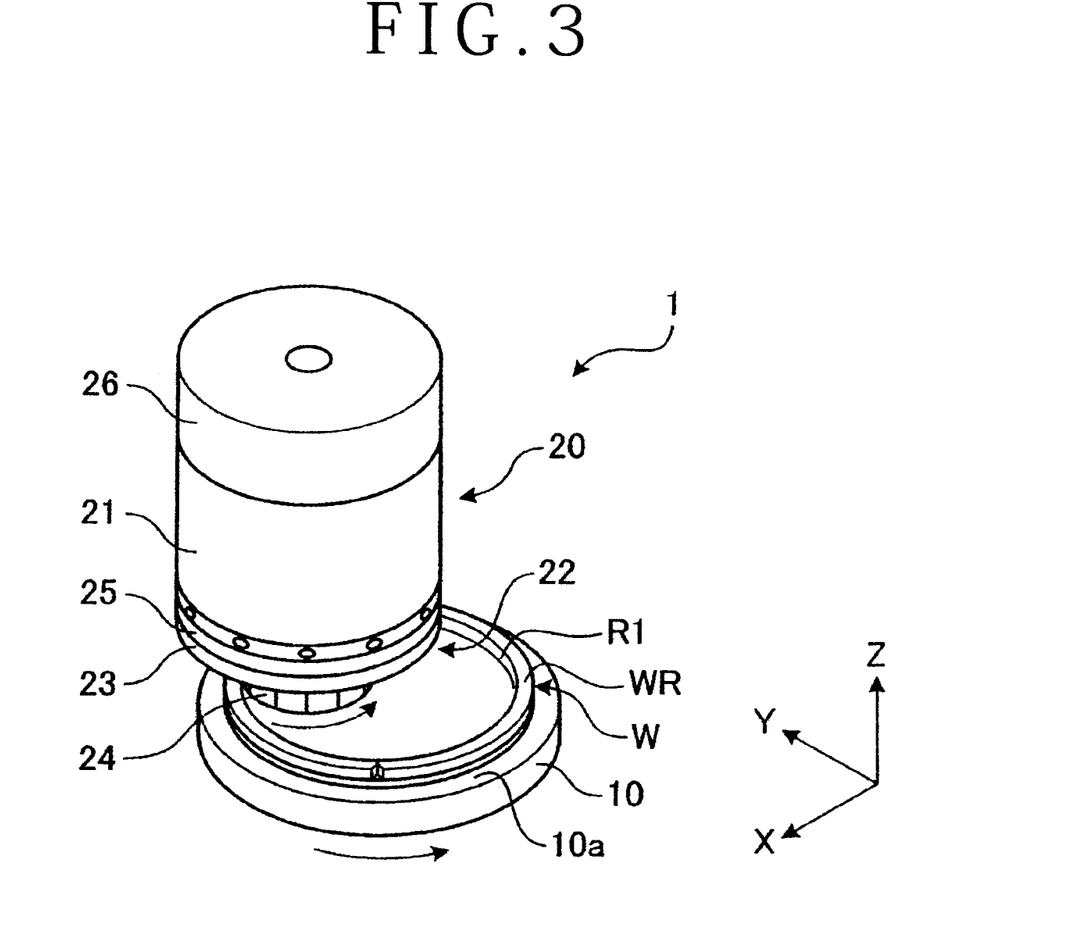
FIG. 3 is a perspective view of the major part of grinding apparatus to carry out the wafer processing method according to the first embodiment.
Figure 8:
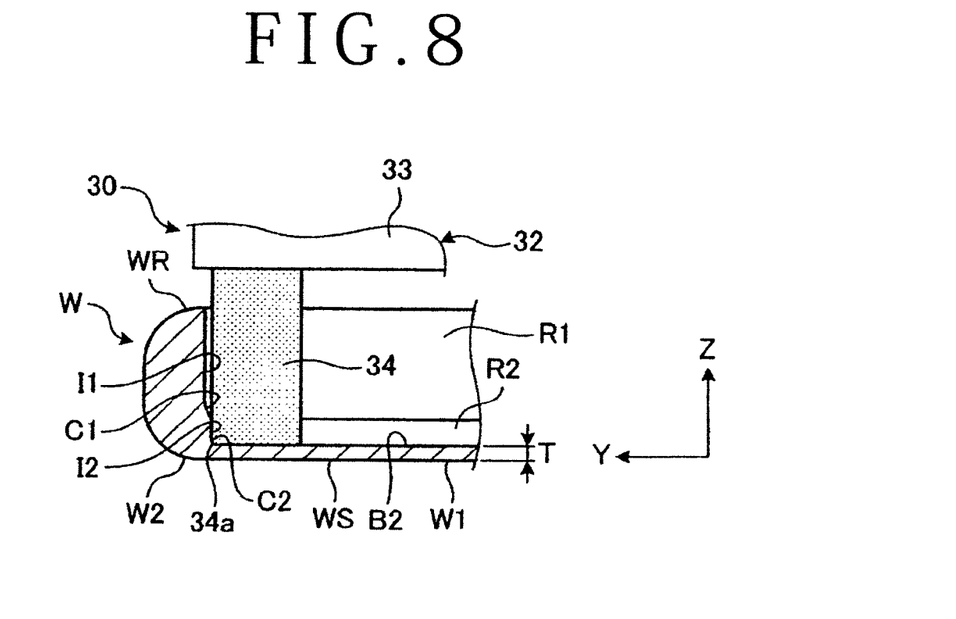
FIG. 8 is an enlarged side view showing a state in which grinding is carried out to a finished thickness of the second grinding step of the wafer processing method according to the first embodiment.

The processing method of the first embodiment is a method in which the wafer W is held on a holding surface 10a of a chuck table 10 of grinding apparatus 1 (shown in FIG. 3) and a region on a back surface WR corresponding to the device region W1 is ground by grinding abrasives 24 and 34 (shown in FIGS. 4 and 5) to set the thickness of the device region W1 to a predetermined finished thickness T (shown in FIG. 8). As shown in FIG. 3, the grinding apparatus 1 includes the chuck table 10 that holds the wafer W, a first grinding unit 20 that carries out a first grinding step on the wafer W held by the chuck table 10, and a second grinding unit 30 (shown in FIG. 5) that carries out a second grinding step on the wafer W held by the chuck table 10.

The chuck table 10 has a circular disk shape in which the part configuring the holding surface 10a is formed of porous ceramic or the like. The chuck table 10 is connected to a vacuum suction source (not shown) via a vacuum suction path (not shown) and sucks the wafer W placed on the holding surface 10a to hold the wafer W. The chuck table 10 is so provided as to be capable of rotating around the shaft center parallel to the Z-axis along the vertical direction by a rotational drive source (not shown). Furthermore, at least one chuck table 10 is provided on a turntable (not shown) provided rotatably around the shaft center of the grinding apparatus 1.

As shown in FIG. 3, the first grinding unit 20 is composed of a spindle (not shown) rotated around the shaft center parallel to the Z-axis along the vertical direction and a grinding wheel 22 mounted to the lower end of the spindle. The spindle is rotatably provided in a spindle case 21 and is rotated around the shaft center by a motor 26. Furthermore, the spindle, i.e. the first grinding unit 20, is so provided as to be capable of moving in the Z-axis direction by a processing feed unit (not shown) and moving in the Y-axis direction parallel to the horizontal direction by a horizontal movement unit (not shown).

The grinding wheel 22 is used in the processing method and includes a first abrasive base 23 having a circular disc shape and plural first grinding abrasives 24 as shown in FIG. 3. The first abrasive base 23 is attached to a flange part 25 provided at the tip of the spindle by bolts. The first grinding abrasives 24 are mounted to the lower surface of the first abrasive base 23 in a circular ring manner. The diameter of the circle formed by the outer circumferential rims of the plural first grinding abrasives 24 is set smaller than the radius of the wafer W. The first grinding abrasives 24 are grinding abrasives for rough grinding formed of resin or vitrified bonded abrasive grains whose abrasive grain size is about #32 to 600 for example.

Figure 5:
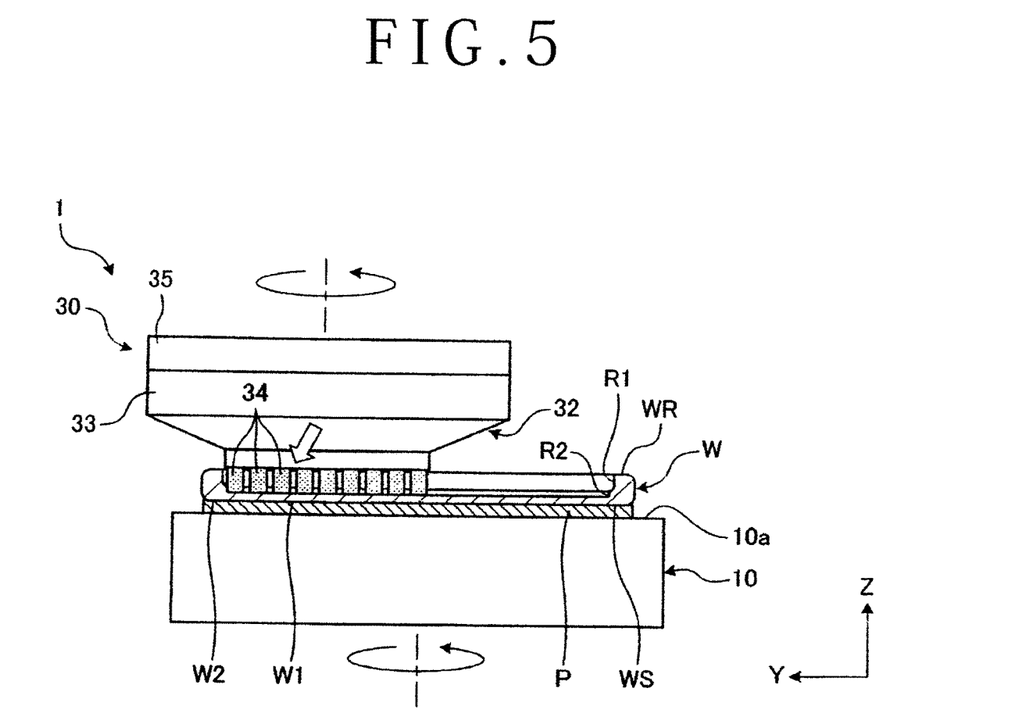
FIG. 5 is a side view showing the outline of a second grinding step of the wafer processing method according to the first embodiment.

The second grinding unit 30 is disposed on the downstream side in the rotation direction of the turntable of the first grinding unit 20. As shown in FIG. 5, the second grinding unit 30 is composed of a spindle (not shown) rotated around the shaft center parallel to the Z-axis direction along the vertical direction and a grinding wheel 32 mounted to the lower end of the spindle. The spindle is rotatably provided in a spindle case (not shown) and is rotated around the shaft center by a motor (not shown). Furthermore, the spindle, i.e. the second grinding unit 30, is so provided as to be capable of moving in the Z-axis direction by a processing feed unit (not shown) and moving in the Y-axis direction by a horizontal movement unit (not shown).

The grinding wheel 32 is used in the processing method and includes a second abrasive base 33 having a circular disc shape and plural second grinding abrasives 34 as shown in FIG. 5. The second abrasive base 33 is attached to a flange part 35 provided at the tip of the spindle by bolts. The second grinding abrasives 34 are mounted to the lower surface of the second abrasive base 33 in a circular ring manner. The diameter of the circle formed by the outer circumferential rims of the plural second grinding abrasives 34 is set smaller than the radius of the wafer W. The second grinding abrasives 34 are grinding abrasives for finish grinding formed of finer abrasive grains than the abrasive grains of the first grinding abrasives 24 for example.

Figure 2:
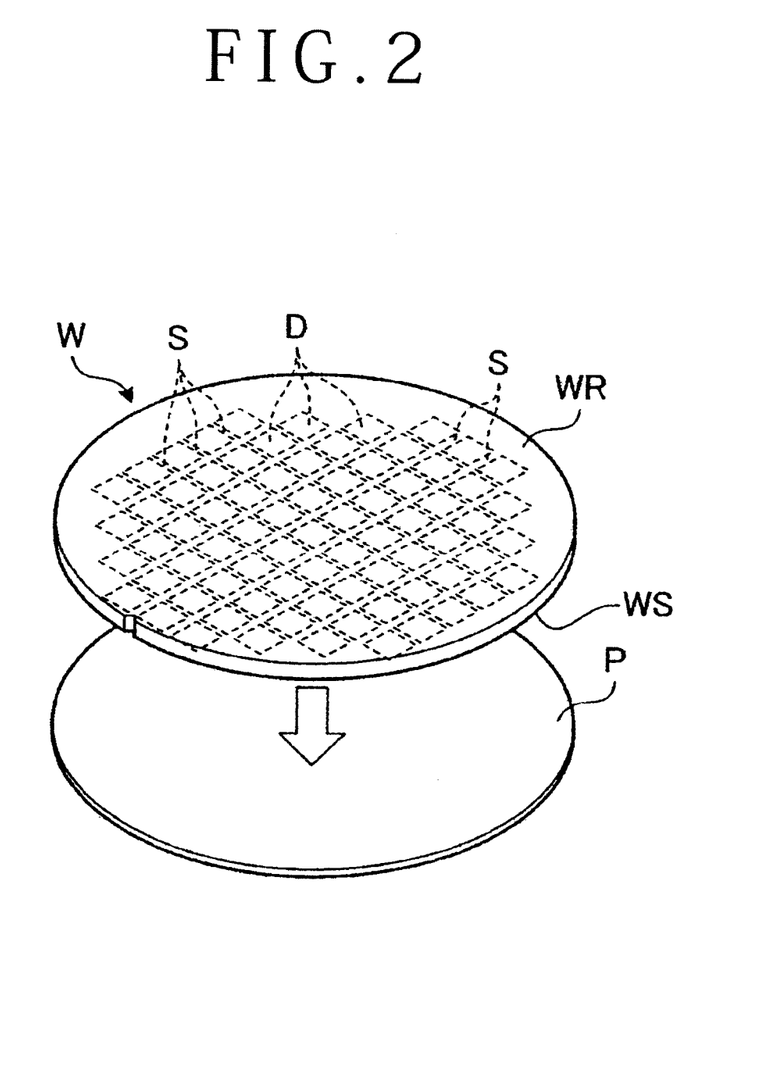
FIG. 2 is a perspective view showing a holding member disposing step of the wafer processing method according to the first embodiment.
Figure 4:
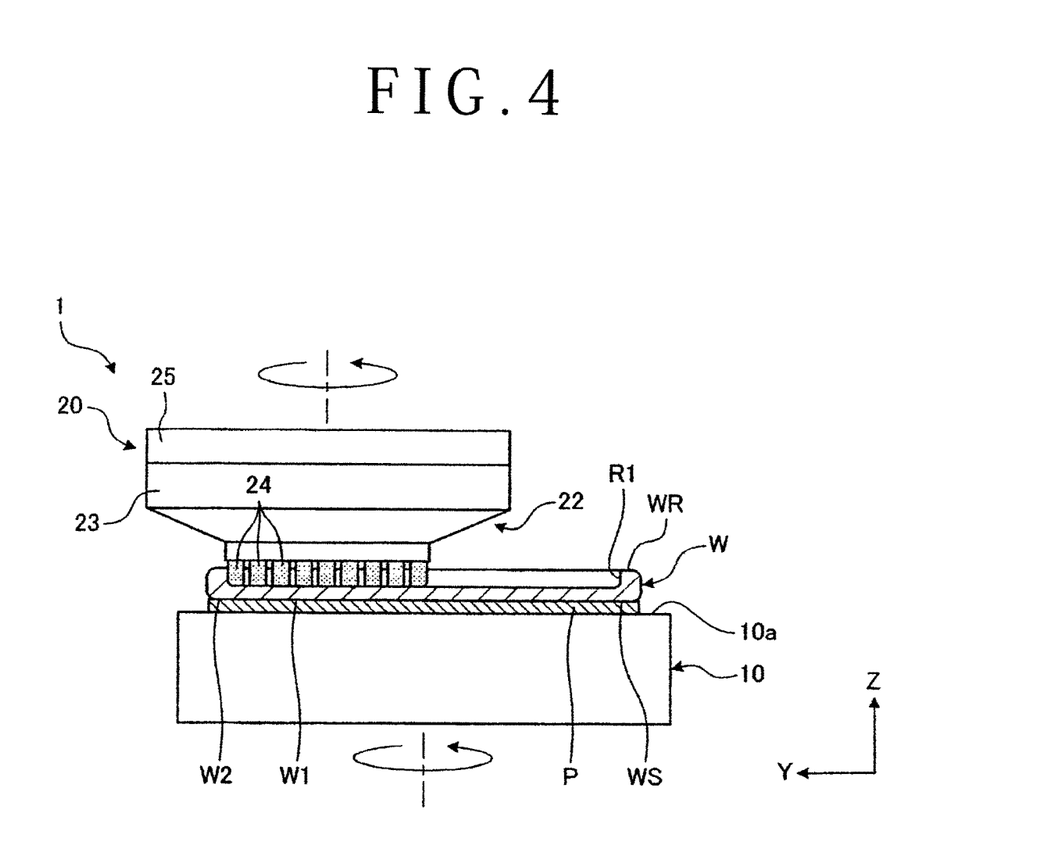
FIG. 4 is a side view showing the outline of a first grinding step of the wafer processing method according to the first embodiment.

The processing method includes a holding member disposing step shown in FIG. 2, a first grinding step shown in FIG. 4, and a second grinding step shown in FIG. 5. In the holding member disposing step, as shown in FIG. 2, a holding member P that has substantially the same size as the wafer W and has a circular plate shape is stuck to the front surface WS of the wafer W. Then, the processing method proceeds to the first grinding step. As the holding member P, a component obtained by applying an adhesive material with a thickness of about 5 to 20 μm on a single surface of a soft base film of polyolefin or the like with a thickness of about 70 to 200 μm is used.

In the first grinding step, first the holding member P stuck to the front surface WS of the wafer W is placed on the holding surface 10a of the chuck table 10 and the side of the front surface WS of the wafer W is held by suction on the chuck table 10 with the intermediary of the holding member P. Then, the chuck table 10 is rotated around the shaft center and the first grinding abrasives 24 of the first grinding unit 20 are rotated around the shaft center. Furthermore, the turntable is rotated and the outer circumferential rims of the first grinding abrasives 24 of the grinding wheel 22 are set opposed to the place corresponding to the inner circumferential rim of the back surface of the peripheral surplus region W2 of the wafer W and the center of the wafer W.

Then, as shown in FIG. 4, the first grinding abrasives 24 are moved in the processing feed direction parallel to the Z-axis along the direction orthogonal to the holding surface 10a (i.e. moved down) by the processing feed unit and the wafer W is ground to form a first circular recess R1 corresponding to the device region W1 in the back surface WR of the wafer W. In the first grinding step, the processing feed (i.e. moving-down) is carried out at a comparatively high speed until the first grinding abrasives 24 abut against the back surface WR of the wafer W. After the first grinding abrasives 24 abut against the back surface WR of the wafer W, the processing feed (i.e. moving-down) is carried out at a lower speed than the speed employed until the abutting. Furthermore, in the first grinding step, the first grinding unit 20 is moved up when the thickness of the bottom part of the first circular recess R1 of the wafer W becomes a predetermined thickness. Then, the processing method proceeds to the second grinding step.

Figure 6:
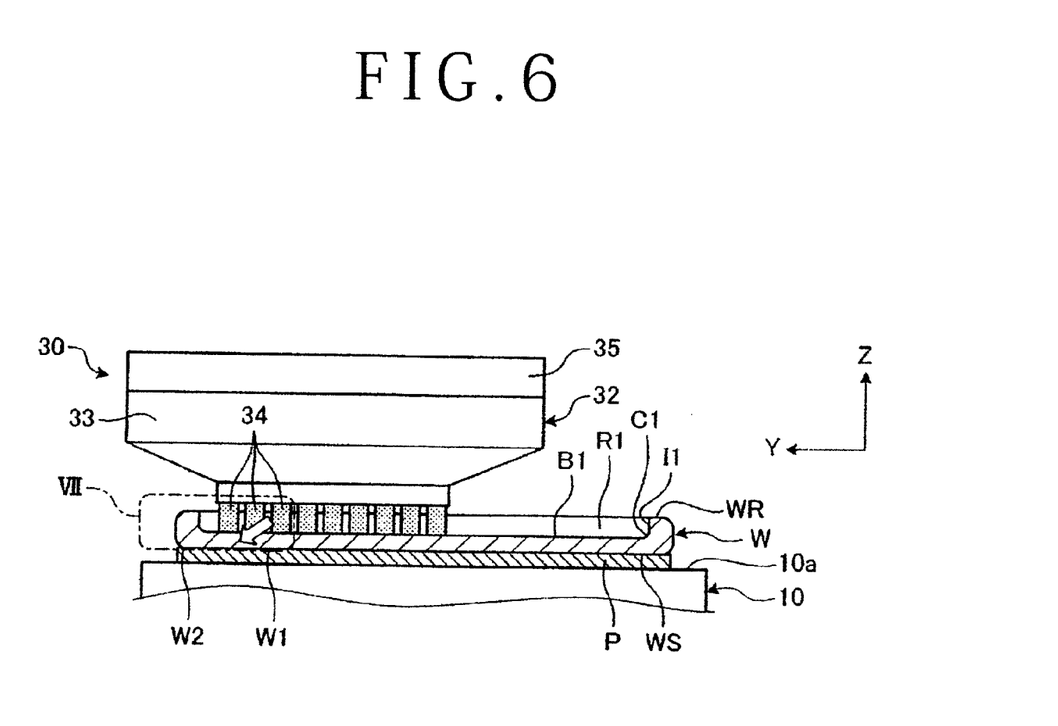
FIG. 6 is a side view showing a state in which second grinding abrasives of the second grinding step of the wafer processing method according to the first embodiment are brought into contact with the bottom surface of a first circular recess.
Figure 7:
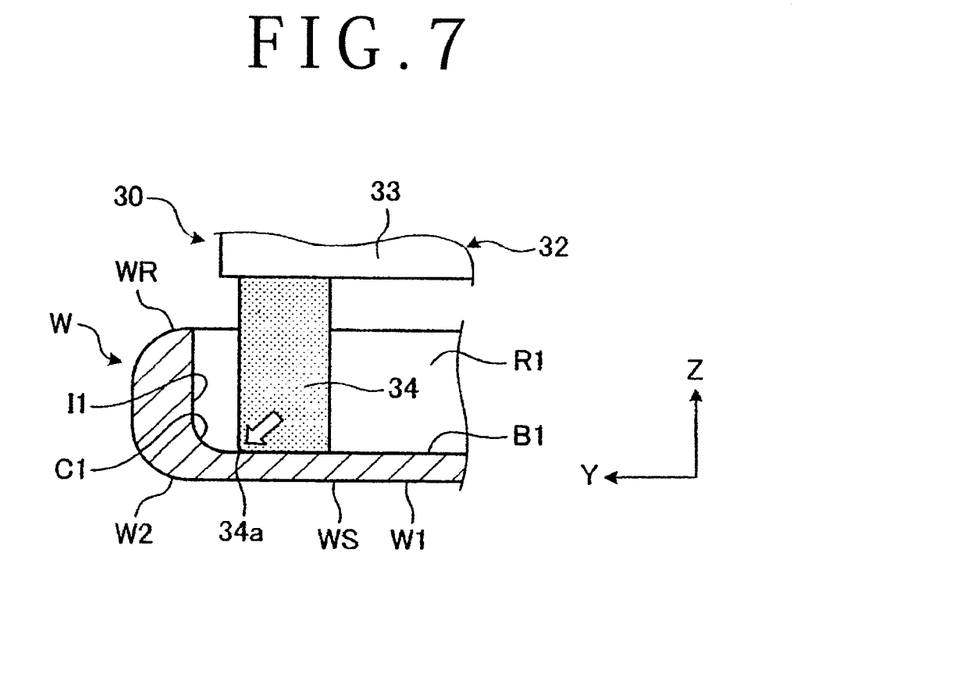
FIG. 7 is an enlarged side view showing part VII in FIG. 6.

The first circular recess R1 is formed into a circular shape as its planar shape and is formed into a hollow from the back surface WR of the wafer W. As shown in FIGS. 6 and 7, the first circular recess R1 is composed of a bottom surface B1 that is parallel to the holding surface 10a and is flat, a curved surface part C1 continuous with the outer rim of the bottom surface B1, and an inner circumferential wall I1 that is continuous with the curved surface part C1 and is orthogonal to the holding surface 10a. The curved surface part C1 links the inner circumferential wall I1 to the bottom surface B1 and is formed into such a curved surface that a ridge line is formed neither between the curved surface part C1 and the bottom surface B1 nor between the curved surface part C1 and the inner circumferential wall I1.

In the second grinding step, the turntable is rotated to locate the second grinding abrasives 34 of the second grinding unit 30 above the first circular recess R1 of the wafer W held by the chuck table 10. In addition, the second grinding abrasives 34 of the second grinding unit 30 are rotated around the shaft center. Then, as shown in FIG. 5, the second grinding abrasives 34 are moved down in an oblique direction that intersects the holding surface 10a and is oriented from the center side of the wafer W toward the periphery of the wafer W by the processing feed unit and the horizontal movement unit, and the second grinding abrasives 34 are pressed against the inside of the first circular recess R1 to grind the inside of the first circular recess R1.

Specifically, in the second grinding step, the second grinding abrasives 34 are moved down in the oblique direction from the center side of the wafer W toward the periphery of the wafer W and the second grinding abrasives 34 are made to abut against the outer rim part of the bottom surface B1 of the first circular recess R1 close to the inner circumferential wall I1 as shown in FIGS. 6 and 7. Then, the second grinding abrasives 34 are further moved down in the oblique direction from the center side of the wafer W toward the periphery of the wafer W. As shown in FIG. 8, the curved surface part C1 is thereby ground by tip outer circumferences 34a of the second grinding abrasives 34 and the bottom surface B1 of the first circular recess R1 is ground by the second grinding abrasives 34. When the thickness of the device region W1 of the wafer W is set to the finished thickness T as shown in FIG. 8, the second grinding unit 30 is moved up. Also in the second grinding step, the processing feed (i.e. moving-down) is carried out at a comparatively high speed until the second grinding abrasives 34 abut against the bottom surface B1 of the first circular recess R1. After the second grinding abrasives 34 abut against the bottom surface B1 of the first circular recess R1, the processing feed (i.e. moving-down) is carried out at a lower speed than the speed employed until the abutting. It is desirable that the processing feed speed of the second grinding abrasives 34 in the Z-axis direction after the second grinding abrasives 34 abut against the bottom surface B1 of the first circular recess R1 be set to a speed equivalent to a conventional processing feed speed at which processing feed of the second grinding abrasives 34 is carried out only in the Z-axis direction.

In the wafer W after the second grinding step, as shown in FIG. 8, a second circular recess R2 is formed inside the first circular recess R1. The second circular recess R2 is formed into a circular shape as its planar shape and is formed into a hollow from the bottom surface B1 of the first circular recess R1. As shown in FIG. 8, the second circular recess R2 is composed of a second bottom surface B2 that is parallel to the holding surface 10a and is flat, a second curved surface part C2 continuous with the outer rim of the second bottom surface B2, and an inner circumferential surface I2 that is continuous with the second curved surface part C2 and is orthogonal to the holding surface 10a. The inner circumferential surface I2 is continuous with the curved surface part C1 of the first circular recess R1. The second curved surface part C2 links the inner circumferential surface I2 to the second bottom surface B2 and is formed into such a curved surface that a ridge line is formed neither between the second curved surface part C2 and the second bottom surface B2 nor between the second curved surface part C2 and the inner circumferential surface I2. The second curved surface part C2 is formed with a smaller radius of curvature than that when the second grinding abrasives 34 are moved down in parallel to the Z-axis.

Then, in the grinding apparatus 1, the turntable is rotated and the wafer W for which the second grinding step has been carried out is removed from the chuck table 10. Then, the wafer W for which the first grinding step and the second grinding step have not yet been carried out is held on the chuck table 10 and the first grinding step and the second grinding step are sequentially carried out as with the previous process.

According to the processing method in accordance with the first embodiment, when the second grinding abrasives 34 are moved down to the bottom surface B1 at a position as close as possible to the inner circumferential wall I1 of the first circular recess R1, the second grinding abrasives 34 are moved down in an oblique direction from the center side of the wafer W toward the periphery. Thus, the tip outer circumferences 34a of the second grinding abrasives 34 are pressed against the curved surface part C1 in the oblique direction from the center side of the wafer W toward the periphery. For this reason, compared with the case in which the second grinding abrasives 34 are moved down in parallel to the Z-axis, the wear (deformation) of the second grinding abrasives 34 is suppressed even when the second grinding abrasives 34 are moved down at a comparatively high speed until getting contact with the bottom surface B1 and the curved surface part C1 is slightly ground by the second grinding abrasives 34. Therefore, the radius of curvature of the second curved surface part C2 of the second circular recess R2 can be made smaller than that when the second grinding abrasives 34 are moved down in parallel to the Z-axis. Thus, the processing method according to the first embodiment provides an effect that, with suppression of extension of the processing time, the second bottom surface B2 of the second circular recess R2 formed after the finish grinding is set wide and thus the flat region in the back surface of the wafer W corresponding to the device region W1 of the wafer W (i.e. the second bottom surface B2) can be expanded.

Second Embodiment

A wafer processing method according to a second embodiment will be described on the basis of the drawings. The wafer processing method according to the second embodiment (hereinafter, referred to simply as the processing method) includes a holding member disposing step and a first grinding step that are the same as those in the processing method of the first embodiment, a second grinding step shown in FIG. 9 and so forth, and a third grinding step shown in FIG. 12.

Figure 9:
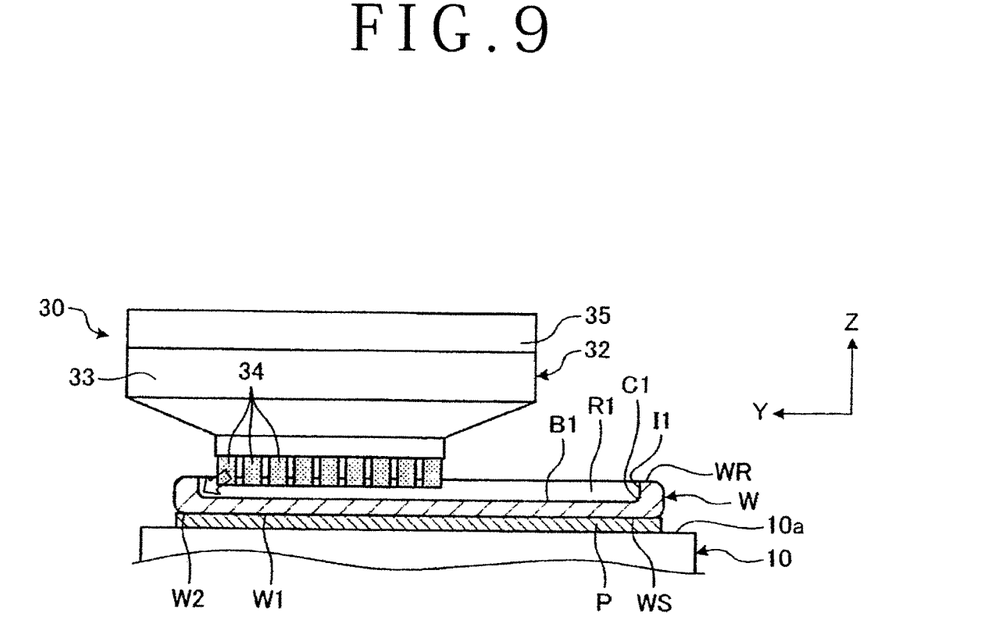
FIG. 9 is a side view showing the outline of a second grinding step of a wafer processing method according to a second embodiment.

In the second grinding step of the processing method according to the second embodiment, similarly to the first embodiment, a turntable is rotated to locate the second grinding abrasives 34 of the second grinding unit 30 above the first circular recess R1 of the wafer W held by the chuck table 10. In addition, the second grinding abrasives 34 of the second grinding unit 30 are rotated around the shaft center. Then, as shown in FIG. 9, the second grinding abrasives 34 are moved down in an oblique direction that intersects the holding surface 10a and is oriented from the center side of the wafer W toward the periphery of the wafer W by the processing feed unit and the horizontal movement unit, and the second grinding abrasives 34 are pressed against the inside of the first circular recess R1 to grind the inside of the first circular recess R1.

Figure 10:
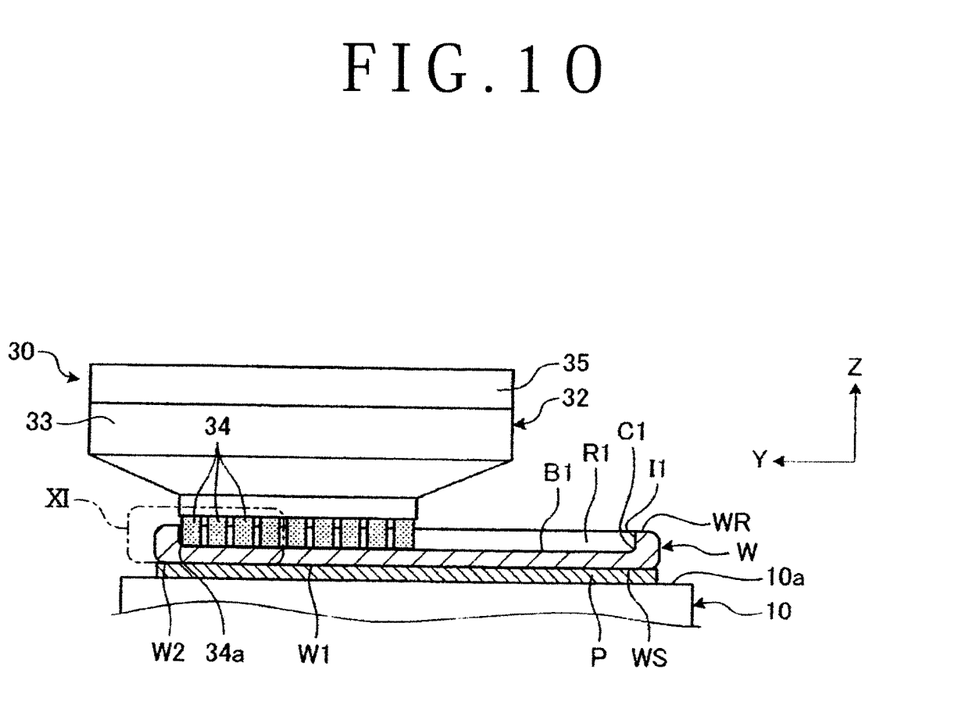
FIG. 10 is a side view showing the outline of the state after the second grinding step of the wafer processing method according to the second embodiment.
Figure 11:
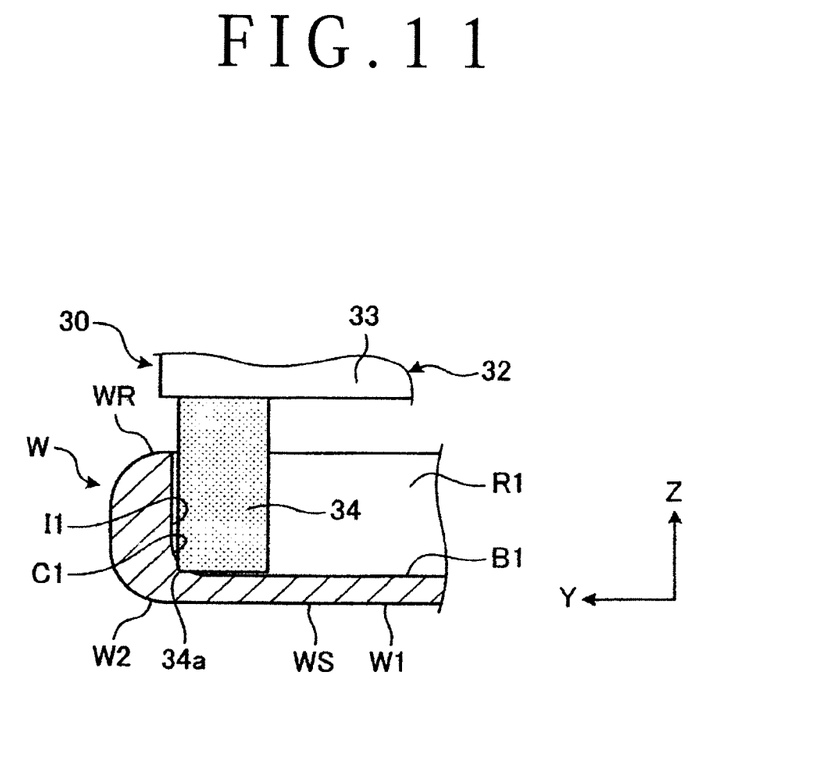
FIG. 11 is an enlarged side view showing part XI in FIG. 10.

Specifically, in the second grinding step according to the second embodiment, the tip outer circumferences 34a of the second grinding abrasives 34 are moved down obliquely from the center side of the wafer W toward the periphery of the wafer W to a position that is slightly inside the inner circumferential wall I1 of the first circular recess R1 and is slightly over the bottom surface B1 of the first circular recess R1. As shown in FIGS. 10 and 11, part of the curved surface part C1 linking the inner circumferential wall I1 and the bottom surface B1 of the first circular recess R1 is thereby ground by the tip outer circumferences 34a of the second grinding abrasives 34. Then, the processing method proceeds to the third grinding step. Also in the second grinding step of the processing method according to the second embodiment, the processing feed (i.e. moving-down) is carried out at a comparatively high speed until the second grinding abrasives 34 grind the curved surface part C1 of the first circular recess R1.

Figure 12:
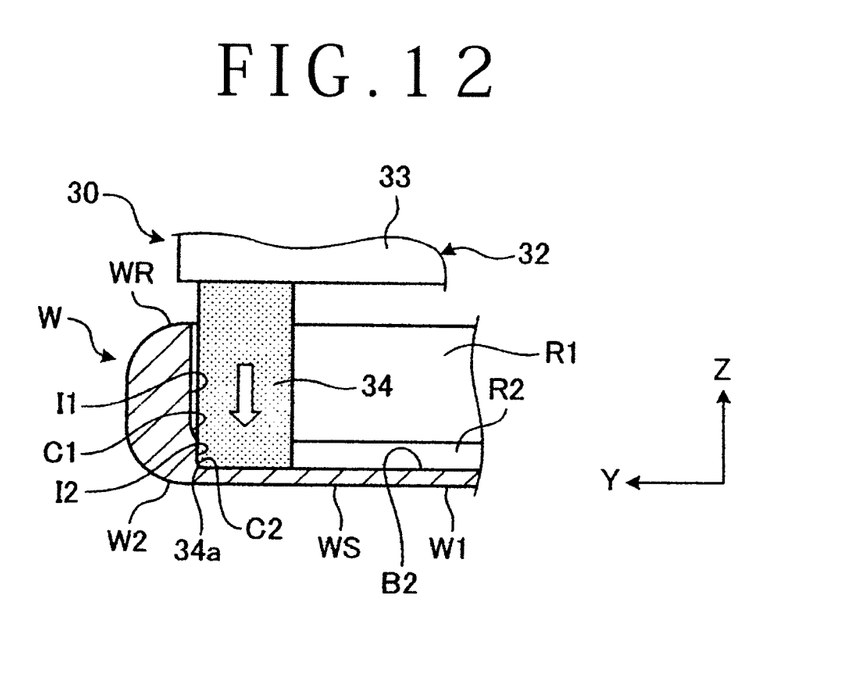
FIG. 12 is an enlarged side view showing the outline of a third grinding step of the wafer processing method according to the second embodiment.

In the third grinding step, after the second grinding step is carried out, as shown in FIG. 12, the second grinding abrasives 34 are moved in the processing feed direction parallel to the Z-axis by the processing feed unit and thereby the curved surface part C1 of the first circular recess R1 is further ground by the tip outer circumferences 34a of the second grinding abrasives 34. In addition, the bottom surface B1 of the first circular recess R1 is ground by the second grinding abrasives 34. Then, when the curved surface part C1 and the bottom surface B1 of the first circular recess R1 are ground and the thickness of the device region W1 is set to the predetermined finished thickness T (shown in FIG. 13), the second grinding unit 30 is moved up. Also in the third grinding step, the processing feed (i.e. moving-down) is carried out at a lower speed than the speed employed until the second grinding abrasives 34 grind the curved surface part C1 of the first circular recess R1 in the second grinding step.

Figure 13:
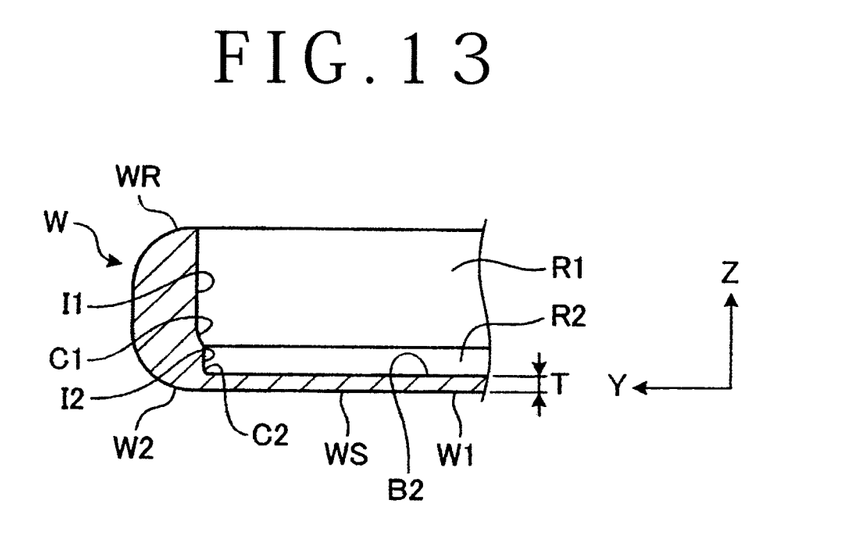
FIG. 13 is an enlarged side view showing the outline of the state after the third grinding step of the wafer processing method according to the second embodiment.

In the wafer W after the third grinding step, as shown in FIG. 13, a second circular recess R2 is formed inside the first circular recess R1. The second circular recess R2 is formed into a circular shape as its planar shape and is formed into a hollow from the bottom surface B1 of the first circular recess R1. As shown in FIG. 13, the second circular recess R2 is composed of a second bottom surface B2 that is parallel to the holding surface 10a and is flat, a second curved surface part C2 continuous with the outer rim of the second bottom surface B2, and an inner circumferential surface I2 that is continuous with the second curved surface part C2 and is orthogonal to the holding surface 10a. The inner circumferential surface I2 is continuous with the curved surface part C1 of the first circular recess R1. The second curved surface part C2 links the inner circumferential surface I2 to the second bottom surface B2 and is formed into such a curved surface that a ridge line is formed neither between the second curved surface part C2 and the second bottom surface B2 nor between the second curved surface part C2 and the inner circumferential surface I2. The second curved surface part C2 is formed with a smaller radius of curvature than that when the second grinding abrasives 34 are moved down in parallel to the Z-axis.

Then, in the grinding apparatus 1, the turntable is rotated and the wafer W for which the third grinding step has been carried out is removed from the chuck table 10. Then, the wafer W for which the first grinding step, the second grinding step, and the third grinding step have not yet been carried out is held on the chuck table 10 and the first grinding step, the second grinding step, and the third grinding step are sequentially carried out as with the previous process.

According to the processing method in accordance with the second embodiment, when the second grinding abrasives 34 are moved down to the curved surface part C1 at a position as close as possible to the inner circumferential wall I1 of the first circular recess R1, the second grinding abrasives 34 are moved down in an oblique direction from the center side of the wafer W toward the periphery. Thus, the tip outer circumferences 34a of the second grinding abrasives 34 are pressed against the curved surface part C1 in the oblique direction from the center side of the wafer W toward the periphery. For this reason, compared with the case in which the second grinding abrasives 34 are moved down in parallel to the Z-axis, the wear (deformation) of the second grinding abrasives 34 is suppressed even when the second grinding abrasives 34 are moved down at a comparatively high speed until getting contact with the bottom surface B1 and the curved surface part C1 is slightly ground by the second grinding abrasives 34. Moreover, in the third grinding step, the processing feed of the second grinding abrasives 34 is carried out in parallel to the Z-axis. Therefore, the radius of curvature of the second curved surface part C2 of the second circular recess R2 can be made smaller than that when the second grinding abrasives 34 are moved down in parallel to the Z-axis. Thus, the processing method according to the second embodiment provides an effect that, with suppression of extension of the processing time, the second bottom surface B2 of the second circular recess R2 formed after the finish grinding is set wide and thus the flat region in the back surface of the wafer W corresponding to the device region W1 of the wafer W (i.e. the second bottom surface B2) can be expanded.

Next, the inventor of the present invention checked the effects of the processing methods according to the above-described first embodiment and second embodiment. For the check, the first circular recesses R1 were formed to each have the inner circumferential wall I1 with a thickness of 2.5 mm in the back surfaces WR of the wafers W having a diameter of 200 mm. Thereafter, the second circular recesses R2 were formed by the second grinding abrasives 34 by the processing methods of present invention product 1 (product corresponding to the first embodiment), present invention product 2 (product corresponding to the second embodiment), and a comparative example (product corresponding to the related art) in such a manner that the thickness of the device regions W1 became 50 μm. Then, the diameters of the second bottom surfaces B2 and the radii of curvature of the second curved surface parts C2 in the second circular recesses R2 were measured. For all of present invention product 1, present invention product 2, and the comparative example, the second grinding abrasives 34 formed of the same vitrified bonded abrasive grains were used. As a result, diameter expansion of the second bottom surface B2 by 0.7 mm in present invention product 1 (product corresponding to the first embodiment) and by 1 mm in present invention product 2 (product corresponding to the second embodiment) relative to the comparative example (product corresponding to the related art) could be confirmed.

Therefore, it has become clear that the wear of the tip outer circumferences 34a of the second grinding abrasives 34 is suppressed and expansion of the device region W1 is enabled by moving the second grinding abrasives 34 in an oblique direction from the center side of the wafer W toward the periphery in the second grinding step.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method in which a wafer having a device region where a plurality of devices are formed in regions marked out by a plurality of streets formed on a front surface in a lattice manner and a peripheral surplus region surrounding the device region is held on a holding surface of a chuck table and a region on a back surface corresponding to the device region is ground by a grinding abrasive to set thickness of the device region to a predetermined finished thickness, the wafer processing method comprising:

a first grinding step of moving a first grinding abrasive in a processing feed direction that is a direction orthogonal to the holding surface and grinding the wafer to form a first circular recess on the back surface of the wafer, the first circular recess being formed by a first curved surface part that links a first inner circumferential wall having a first diameter and a first bottom surface of the first circular recess; followed by a second grinding step of moving a second grinding abrasive, formed of finer abrasive grains than the first grinding abrasive, in an oblique direction from a center area of the wafer toward the peripheral surplus region of the wafer and grinding the first circular recess to a position that is inside of the first inner circumferential wall of the first circular recess by a predetermined distance and is closer to the back surface of the wafer than the first bottom surface of the first circular recess by a second predetermined distance, the second grinding step forming a second circular recess having a second inner circumferential wall having a second diameter smaller than said first diameter, a second bottom surface and a second curved surface that links the second circumferential wall to the second bottom surface, the second circumferential wall linking the second curved surface to the first curved surface, followed by a third grinding step of moving the second grinding abrasive in the processing feed direction at a lower speed and grinding the second bottom surface to set the thickness of the device region to a predetermined finished thickness.

* * * * *